(12) United States Patent
Su et al.

(10) Patent No.: US 9,570,635 B2
(45) Date of Patent: Feb. 14, 2017

(54) SEMICONDUCTOR DEVICE AND PATTERNING METHOD FOR PLATED ELECTRODE THEREOF

(71) Applicant: ATOMIC-ENERGY COUNCIL-INSTITUTE OF NUCLEAR ENERGY RESEARCH, Taoyuan County (TW)

(72) Inventors: Yu-Han Su, Taoyuan County (TW); Wei-Yang Ma, Taoyuan County (TW); Tsun-Neng Yang, Taoyuan County (TW); Cheng-Dar Lee, Taoyuan County (TW)

(73) Assignee: Atomic Energy Council—Institute of Nuclear Energy Research, Taoyuan County (TW)

( * ) Notice: Subject to any disclaimer, the term of this patent is extended or adjusted under 35 U.S.C. 154(b) by 0 days.

(21) Appl. No.: 14/608,465

(22) Filed: Jan. 29, 2015

(65) Prior Publication Data

US 2016/0126369 A1    May 5, 2016

(30) Foreign Application Priority Data

Nov. 4, 2014 (TW) .............................. 103138163 A

(51) Int. Cl.
*H01L 31/0216* (2014.01)
*H01L 31/18* (2006.01)
*H01L 31/0224* (2006.01)

(52) U.S. Cl.
CPC ... *H01L 31/02168* (2013.01); *H01L 31/02167* (2013.01); *H01L 31/022441* (2013.01); *H01L 31/18* (2013.01)

(58) Field of Classification Search
None
See application file for complete search history.

(56) References Cited

U.S. PATENT DOCUMENTS

| | | | |
|---|---|---|---|
| 2013/0199606 A1* | 8/2013 | Sheng | H01L 31/022425 136/256 |
| 2015/0325716 A1* | 11/2015 | Baker-O'Neal | H01L 31/022425 136/256 |
| 2016/0072001 A1* | 3/2016 | Payo | H01L 31/1804 438/57 |

* cited by examiner

*Primary Examiner* — Robert Carpenter
(74) *Attorney, Agent, or Firm* — Rosenberg, Klein & Lee

(57) ABSTRACT

The present invention discloses in detail a semiconductor device and a patterning method for the plated electrode thereof. By using the laser ablation method according to the prior art, the semiconductor substrate below the ARC is damaged by direct destructive burning. According to the present invention, an additional protection layer is inserted between the ARC and the semiconductor substrate. Then a laser is used for heating and liquefying the protection layer below the ARC, and thus separating the ARC from the liquefied protection layer underneath and forming pattered openings. Afterwards, by a plating process, nickel and copper can plated.

9 Claims, 3 Drawing Sheets

SEMICONDUCTOR DEVICE AND PATTERNING METHOD FOR PLATED ELECTRODE THEREOF

FIELD OF THE INVENTION

The present invention relates generally to a patterning method for plated electrodes, and particularly to a patterning method applicable to a semiconductor device having an anti-reflection coating or other dielectric layers such as a solar cell in particular. Thereby, without damaging the semiconductor substrate, the anti-reflection coating or other dielectric layers can be patterned and removed to form patterned and plated metal electrodes.

BACKGROUND OF THE INVENTION

In semiconductor fabrication, the metal process is normally required. Because metals contact patterned regions only, the photoresist process and the lithography method are mostly adopted currently for achieving the purpose of patternization. For normal semiconductor fabrication, which has higher costs, although the patterning method adds some extra costs, it is still relatively acceptable. Nonetheless, for low-cost solar-cell fabrication, using the photoresist process will apparently increase the cost. Thereby, the photoresist is not suitable for defining metal patterns in solar cells.

For the current metal process of solar cells, the screen printing method is adopted to form metal electrodes. The screen printing process is very simple and fast. Nonetheless, as crystalline silicon solar cells are developing towards the two directions of low costs and high efficiency, forming silver electrodes by screen printing faces bottlenecks. It is difficult to make breakthrough.

The cost difference between copper and silver is enormous while their conductivity values are approximate. Accordingly, under the consideration of costs, the International Technology Roadmap for Photovoltaic (ITRPV) predicts that the metal silver currently in use will be replaced by the metal copper gradually. The plated nickel/copper electrode is regarded as the potential choice of positive electrodes for the next-generation solar cells. In addition, the plating process enables electrodes to have better aspect ratios and thus the efficiency can be improved by reducing the shading area of solar cells. Besides, the metal contact resistance between nickel and silicon substrate is also superior to the silver paste in the screen printing process. Thereby, the efficiency of solar cell can be enhanced as well.

The current bottleneck of nickel/copper electrode plating process is that the patterning method for metals is too complicated or the equipment is costly. Thereby, the competitivity of nickel/copper plated electrodes cannot surpass that of the screen printing process. Take the laser ablation for example. It uses laser to burn and remove the existing anti-reflection coating (ARC) on the surface of solar cells. Afterwards, the metal plating procedure is performed. The ARC is an excellent blocking layer for plating. The region with the ARC removed can be plated with metal, and thereby achieving the purpose of metal patternization with ease. The laser process has the advantages of simplicity and rapidity, making it suitable for low-cost mass production.

SUMMARY

An objective of the present invention is to provide a patterning method for the plated electrode of a semiconductor device. A protection layer is additionally deposited between the ARC or other dielectric layer, and the semiconductor substrate. Said protection layer can be not only as a protection layer but also affords further functions, such as combines the functions of protective and passivation. According to a preferred embodiment, the protection layer is composed by amorphous silicon. Then, heating is performed by laser for heating and liquefying the protection layer, resulting in spontaneous ablation and removal of the ARC or the other dielectric layer thereon. Then the plating process can be used for finishing the procedure of plating nickel or copper on the regions with the ARC or the other dielectric layer removed.

Another objective of the present invention is to provide a patterning method for the plated electrode of a semiconductor device. A protection layer is used for protecting the semiconductor substrate. Thereby, when laser is used for ablating the ARC or the other dielectric layer, the semiconductor substrate will not be damaged and the operational efficiency of the product will not be reduced. In addition, for crystalline silicon solar cells, the protection layer can also be used as the passivation layer for the silicon substrate. Accordingly, the present invention is especially suitable for solar cell applications.

Still another objective of the present invention is to provide a patterning method for the plated electrode of a semiconductor device. Compared with laser ablation, thanks to the insertion of the protection layer, the ablation method for the ARC and the other dielectric layer is altered. Thereby, the requirement for the laser adopted can be lessened. Picosecond-grade, nanosecond-grade and microsecond-grade lasers, such as ultraviolet, blue, green or red laser, are all sufficient, which can reduce substantially the equipment cost in production.

A further objective of the present invention is to provide a semiconductor device comprising a protection layer. Thanks to the addition of the protection layer, an improved laser ablation method can be adopted for generating patterned openings on the ARC or other dielectric layer and forming electrodes therein. Accordingly, a patterned electrode structure can be fabricated.

In order to achieve the objectives described above, the present invention discloses a patterning method for the plated electrode of a semiconductor device. The semiconductor device comprises a semiconductor substrate. The method comprises the following steps. First, dispose a protection layer on the semiconductor substrate. Secondly, dispose an ARC or a dielectric layer on the protection layer. Thirdly, use a laser to heat the protection layer below the ARC or the dielectric layer for heating and liquefying the protection layer. The ARC or the dielectric layer on the liquefied protection layer is thereby separated from the protection layer and removed, forming at least an opening and exposing the protection layer. Fourthly, plate and form an electrode in the opening. According to the steps, at least an opening can be formed in the ARC or the dielectric layer without damaging the semiconductor substrate, and an electrode can be form on the protection layer via the patterned opening.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
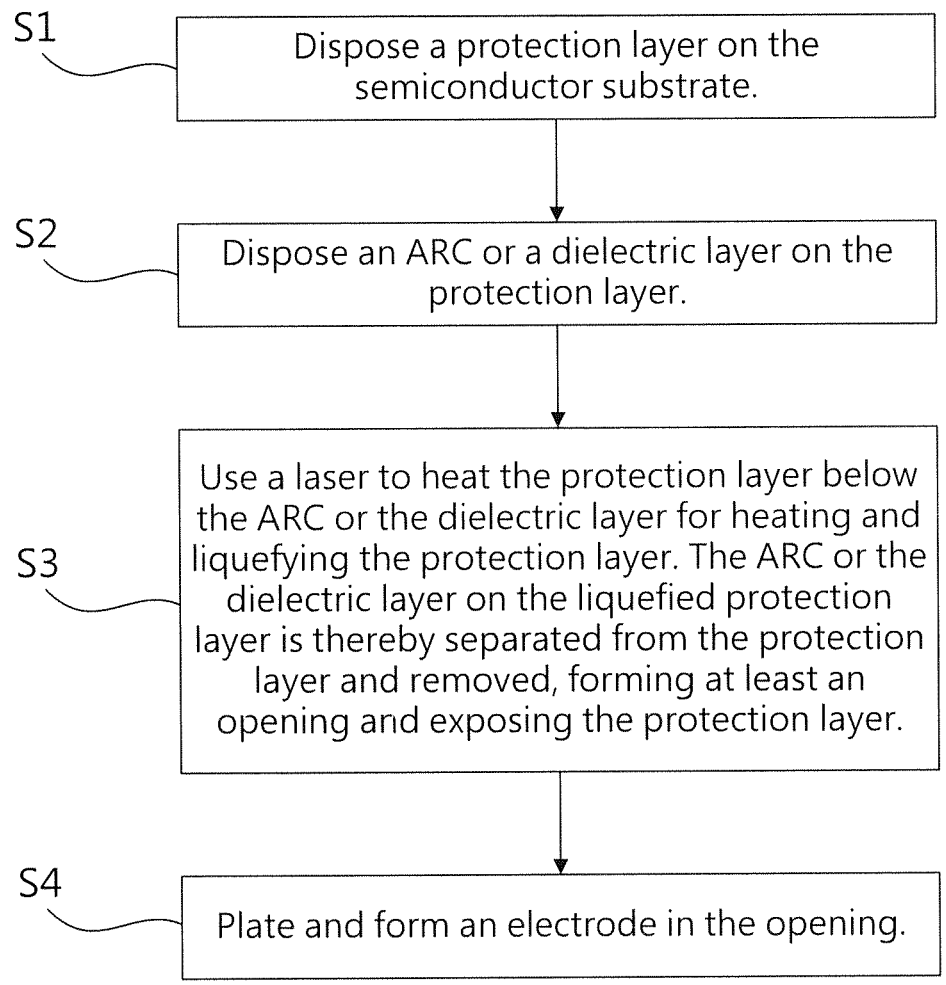
FIG. 1 shows a flowchart according to a preferred embodiment of the present invention.

First, please refer to FIG. 1. The method according to a preferred embodiment of the present invention is used for forming nickel-copper electrodes on the front surface of a semiconductor substrate by plating. Said electrodes can be used in optoelectronics, for example, as the positive electrodes of solar cells. The method comprises the following steps.

Step S1: Dispose a protection layer on the semiconductor substrate.
Step S2: Dispose an ARC or a dielectric layer on the protection layer.
Step S3: Use a laser to heat the protection layer below the ARC or the dielectric layer for heating and liquefying the protection layer. The ARC or the dielectric layer on the liquefied protection layer is thereby separated from the protection layer and removed, forming at least an opening and exposing the protection layer.
Step S4: Plate and form an electrode in the opening.

The structural changes according to the above steps are shown in FIGS. 2A to 2D. First, the plasma-enhanced chemical vapor deposition (PECVD) is adopted for depositing a protection layer 2 on a semiconductor substrate 1. The limiting conditions for the thickness of the protection layer 2 depend on the type of the device. If the semiconductor device is not a solar cell, the thickness of the protection layer 2 can be 1 to 100 nm. In a preferred embodiment, considering the influence of light shading, the thickness of the protection layer 2 should be controlled between 3 and 30 nm for preventing blocking of light reaching the semiconductor substrate 1 by the thick protection layer 2, which will lead to lowering in the efficiency of the solar cell. The material of the protection layer 2 can be amorphous silicon, silicon nitride, silicon dioxide, or other materials capable of implanting the steps disclosed by the present invention (namely, partially liquefied by laser heating and thus ablating the solid ARC). Because of the option of the material is various, said protection layer 2 can be not only as a protection layer but also affords further functions, such as combines the functions of protective and passivation, which depends on the nature of material. Base on the consideration of cost and passivation effect, amorphous silicon is preferred according to the present invention. Besides, the semiconductor substrate 1 can be a silicon substrate.

According to an embodiment of the present invention, an ARC 3 formed by silicon nitride or silicon dioxide is disposed on the protection layer 2 with a thickness of approximately 1 to 100 nm. This ARC 3 can also be deposited by using the PECVD system. Thereby, it can be deposited in succession by using the same equipment used for forming the protection layer 2, resulting in simplicity and high efficiency in fabrication. This ARC 3 can be replaced by a dielectric layer formed by dielectric materials. In addition, the materials for forming the protection layer 2 are not identical to those for forming the ARC 3. PECVD is not the only way to dispose said protection layer, ARC or dielectric layer, instead, metal-organic chemical vapor deposition (MOCVD), atomic layer deposition (ALD), hydride vapor phase epitaxial (HVPE), or other physical/chemical methods are also available.

In the plating process, metals will not be formed on the ARC 3. Thereby, according to the present invention, a laser is adopted for partially heating the protection layer 2 below the ARC 3. The protection layer 2 in this region will be heated and liquefied. Then the ARC 3 on the liquefied region will be separated from the protection layer 2 and thus removed.

Figure 2A:
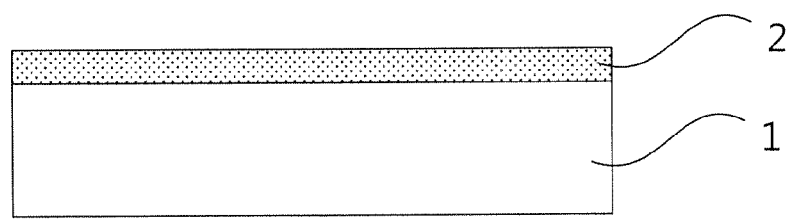
FIGS. 2A to 2D show schematic diagrams of structural changes according a preferred embodiment of the present invention.
Figure 2B:
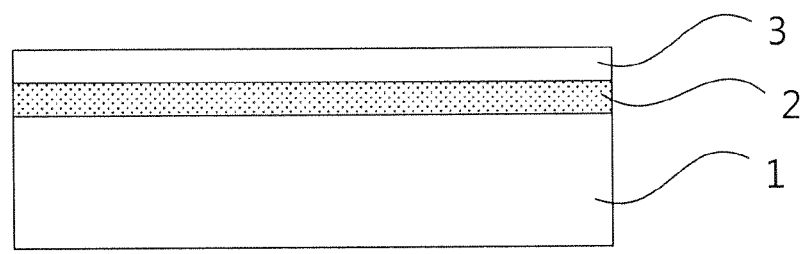
Figure 2C:
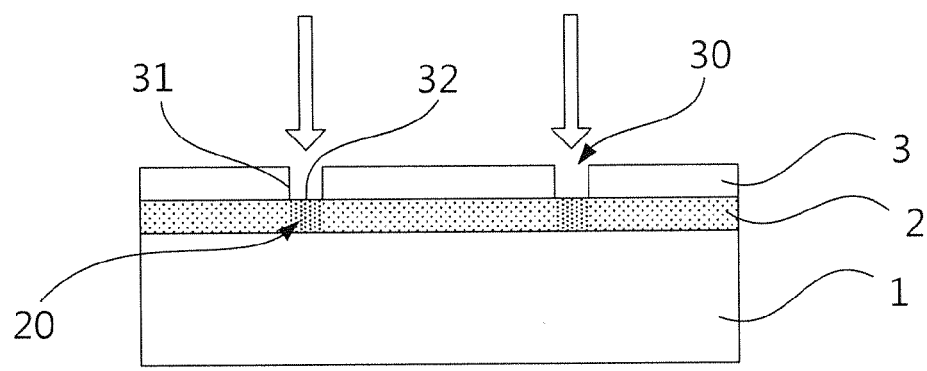
Figure 2D:
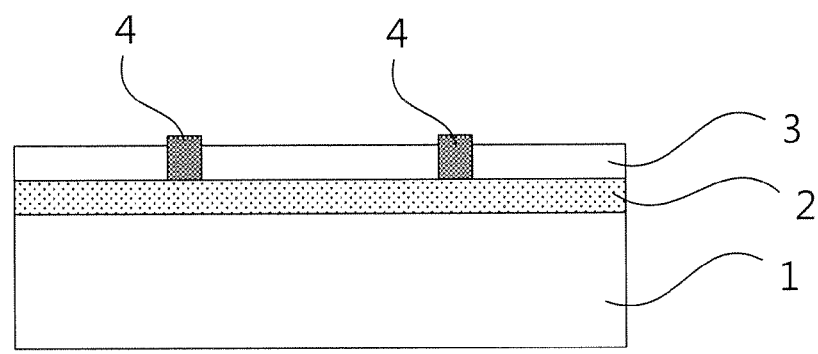

As shown in FIG. 2C, the protection layer 2 will be partially liquefied after being heated by the laser and hence forming a plurality of liquefied regions 20. The ARC 3 on the protection layer 2 within the plurality of liquefied regions 20 will be ablated, forming local openings 30. The laser adopted according to the present invention can be microsecond-grade, nanosecond-grade, or picosecond-grade green, red, blue or ultraviolet laser. It is possible not required to use ultraviolet and picosecond-grade lasers only, resulting in substantial reduction in equipment cost. The reason is that, according to the present invention, it is not necessary to perform destructive burning and removal on ultra-shallow silicon substrates. Instead, precise heating is required for heating and thus partially liquefying the protection layer 2. Consequently, the ARC 3 thereon will be ablated. To elaborate, the method of laser heating is to liquefy the protection layer 2 partially and thus disconnecting the contact surface between the liquefied region and the ARC 3. Besides, the width of the opening 30 is between 1 and 100 um and the thickness of the ARC 3 is only approximately 80 nm, the aspect ratio is extremely small. Thereby, as the liquefied regions 20 are formed, the sidewalls 31 are not sufficient to support the ARC 3 on the liquefied regions 20 and thus leading to ablation. On the bottom surface of the ARC 3 neighboring the liquefied protection layer 2, the ARC 3 will also be separated. Accordingly, the ARC 3 will be ablated partially and forming the openings 30.

Moreover, thanks to the protection of the protection layer 2, the structure of the semiconductor substrate 1 will not be damaged by the laser and the expected operational efficiency can be maintained. According to a preferred embodiment, the material of the protection layer 2 is amorphous silicon and the material of the ARC 3 is silicon nitride. The liquefying temperature of amorphous silicon is lower than that of the silicon substrate (approximate 1693K) by around 200K to 300K. In other words, the liquefying temperature of amorphous silicon is around 1400K to 1500K. Thereby, under proper control of the laser power, the protection layer 2 is heated to 500K to 2000K, and 1400K to 1500K is preferred. In addition, because the temperature of the ARC 3 will not exceed the melting point, 2173K, of silicon nitride, it is confirmed that only amorphous silicon can generate the liquefied regions 20 while the semiconductor substrate 1 underneath remains intact. Spontaneous ablation of the partial ARC 3 is not achieved by burning removal.

In the subsequent process steps for metal plating, the light-induced nickel plating (LINP), the light-induced plating (LIP), or the electroless plating can be adopted in the present invention. Thereby, metals can be reduced directly on the regions with the ARC 3 removed, namely, in the openings 30. Then, for LINP and LIP processes, metals are reduced in the openings 30 by tunneling currents passing through the protection layer 2. The metals nickel, tin, copper or alloys thereof thus precipitate from the plating solution and are plated on the protection layer 2, forming positive electrodes 4.

In order to enhance the quality of device, according to the present invention, after the laser is removed, before the step of forming the exposed positive electrodes 4 on the protection layer 2, a step can be further included.

Step S3-1: Etch the oxides generated by the high-temperature process of laser on the surface of the protection layer.

This step is performed by an additional chemical etching process for clearing oxides unfavorable for plating. Thereby, the quality of subsequent plating can be guaranteed.

Figure 3:
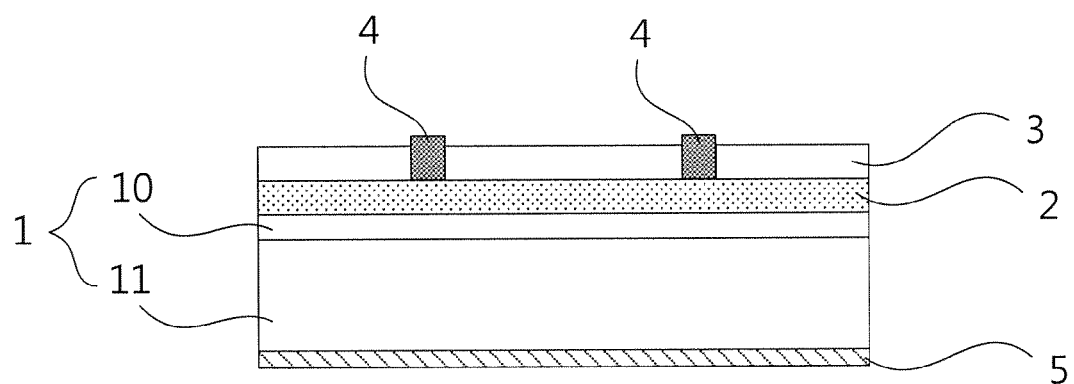
FIG. 3 shows a structural schematic diagram according to a preferred embodiment of the present invention for illustrating the structure of a solar cell.

In addition to the steps and the formed structures as described above, while fabricating solar cells, the overall schematic diagram of the structure according to the present invention is illustrated in FIG. 3. A back electrode 5 having a normal material of aluminum is formed below the semiconductor substrate 1. The semiconductor substrate 1 includes a PN junction formed by front-end diffusion processes. For example, as shown in FIG. 3, an N-type emitter 10 ($n^+$ emitter) and a P-type silicon substrate 1 are shown, illustrating a general structure of solar cells. The structure can be formed by the methods according to the prior art and is not the scope limited by the present invention. Furthermore, the applications of the present invention are not limited to the fabrication method and structure for solar cells of this type. Instead, for those electrode plating processes for semiconductor devices having the semiconductor substrate and the ARC, an extra protection layer can be added for protection. Combining the advantage of low line width of lasers, patterned openings can be formed on the ARC precisely and rapidly.

To sum up, the present invention discloses in detail a semiconductor device and a patterning method for the plated electrode thereof. By using the laser ablation method according to the prior art, the semiconductor substrate below the ARC is damaged by direct destructive burning. According to the present invention, an additional protection layer is inserted between the ARC and the semiconductor substrate. Then a laser is used for heating and liquefying the protection layer below the ARC, and thus separating the ARC from the liquefied protection layer underneath and forming patterred openings. Afterwards, by a plating process, nickel and copper can plated. The advantages of the present invention include not damaging the semiconductor substrate. In addition, laser equipment with lower requirements can be adopted while maintaining the advantages of simplicity, rapidity, low line width, and mass productivity of lasers. Moreover, because the damage caused by the process disclosed according to the present invention on the semiconductor substrate is extremely slight, it can be adopted for fabricating the bus bars used for collecting the currents of the positive electrodes of solar cells. It is not required to fabricate the bus bars using another method. Based on the above advantages, the present invention is undoubtedly a practical and economical patterning method for forming a semiconductor and the plated electrode thereof.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A patterning method for a plated electrode of a semiconductor device, said semiconductor device comprising a semiconductor substrate, and comprising steps of:
   disposing a protection layer on said semiconductor substrate;
   disposing an anti-reflection coating or a dielectric layer on said protection layer, wherein a melting point temperature of said anti-reflection coating is higher than said melting point temperature of said protection layer;
   using a laser to heat and liquefy a portion of said protection layer below said anti-reflection coating or said dielectric layer, thus separating and removing said anti-reflection coating on said liquefied protection layer, and forming at least an opening and exposing said protection layer, wherein a temperature of said protection layer in said laser heating and liquefying step is higher than said melting point temperature of said protection layer and lower than said melting point temperature of said anti-reflection coating; and
   plating and forming an electrode in said opening.

2. The patterning method for the plated electrode of a semiconductor device of claim 1, wherein said semiconductor device is an optoelectronic.

3. The patterning method for the plated electrode of a semiconductor device of claim 2, wherein a thickness of said protection layer is between 1 to 100 nanometers.

4. The patterning method for the plated electrode of a semiconductor device of claim 1, wherein a width of said opening is between 1 to 100 micrometers.

5. The patterning method for the plated electrode of a semiconductor device of claim 1, wherein a thickness of said anti-reflection coating or said dielectric layer is between 1 to 100 nanometers.

6. The patterning method for the plated electrode of a semiconductor device of claim 1, wherein said laser in said step of using said laser to heat a portion of said protection layer below said anti-reflection coating or said dielectric layer is a microsecond, nanosecond, or picosecond laser.

7. The patterning method for the plated electrode of a semiconductor device of claim 1, wherein the temperature of said protection layer is raised to 500K to 2000K in said step of using said laser to heat a portion of said protection layer below said anti-reflection coating or said dielectric layer.

8. The patterning method for the plated electrode of a semiconductor device of claim 1, and before said step of plating and forming said electrode in said opening, further comprising a step of etching oxides generated by laser heating on a surface of said protection layer.

9. The patterning method for the plated electrode of a semiconductor device of claim 1, wherein a plasma-enhanced chemical vapor deposition method is used for deposition in succession in said steps of disposing said protection layer and disposing said anti-reflection coating or said dielectric layer.

* * * * *